United States Patent
Castro et al.

(10) Patent No.: US 9,406,362 B2
(45) Date of Patent: Aug. 2, 2016

(54) MEMORY TILE ACCESS AND SELECTION PATTERNS

(71) Applicant: MICRON TECHNOLOGY, INC., Boise, ID (US)

(72) Inventors: Hernan A. Castro, Shingle Springs, CA (US); Kerry Dean Tedrow, Folsom, CA (US); Jack Chinho Wu, San Jose, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 470 days.

(21) Appl. No.: 13/919,758

(22) Filed: Jun. 17, 2013

(65) Prior Publication Data
US 2014/0372713 A1 Dec. 18, 2014

(51) Int. Cl.
| | | |
|---|---|---|
| G11C 8/00 | (2006.01) | |
| G11C 8/10 | (2006.01) | |
| G11C 8/12 | (2006.01) | |
| G11C 5/02 | (2006.01) | |

(52) U.S. Cl.
CPC .. G11C 8/10 (2013.01); G11C 8/12 (2013.01); *G11C 5/025* (2013.01)

(58) Field of Classification Search
CPC .............. G11C 8/10; G11C 8/12; G11C 5/025
USPC ................... 365/230.03, 185.11, 63, 189.011, 365/189.02, 230.01, 230.02, 230.04, 365/230.06, 230.09
See application file for complete search history.

(56) References Cited

U.S. PATENT DOCUMENTS

| | | | |
|---|---|---|---|
| 2010/0138587 A1* | 6/2010 | Hutson | G06F 12/0607 711/5 |
| 2012/0187363 A1 | 7/2012 | Liu et al. | |
| 2012/0257448 A1 | 10/2012 | Ong | |
| 2012/0306902 A1 | 12/2012 | MacWilliams et al. | |
| 2012/0314477 A1 | 12/2012 | Siau | |
| 2013/0343129 A1* | 12/2013 | Wakchaure | G11C 16/10 365/185.17 |

FOREIGN PATENT DOCUMENTS

WO    WO 2012-074662     6/2012

OTHER PUBLICATIONS

International Search Report and Written Opinion of the International Searching Authority for International Application No. PCT/US2014/041034, mailed Oct. 22, 2014, in 12 pages.

* cited by examiner

*Primary Examiner* — Fernando Hidalgo
(74) *Attorney, Agent, or Firm* — Holland & Hart LLP

(57) ABSTRACT

In one embodiment, an apparatus, such as a memory device, is disclosed. The apparatus includes multiple memory tiles and selection circuitry. Each memory tile has an array of storage components at intersections of a plurality of digit line conductors and a plurality of access line conductors. The selection circuitry includes line drivers that select a storage component of a memory tile based on a corresponding digit line conductor and a corresponding access line conductor to the storage component. The selection circuitry may select two or more storage components of a memory tile in a consecutive manner before selecting the storage components of a different memory tile.

13 Claims, 8 Drawing Sheets

MEMORY TILE ACCESS AND SELECTION PATTERNS

TECHNICAL FIELD

Embodiments of the present invention generally relate to integrated circuits and more specifically to memory tile access and selection patterns for integrated circuits, such as memory devices.

BACKGROUND

There are many different types of memory, including random-access memory (RAM), read only memory (ROM), dynamic random access memory (DRAM), synchronous dynamic random access memory (SDRAM), resistive memory, and flash memory, among others. Types of resistive memory include phase change memory, programmable conductor memory, and resistive random access memory (RRAM), among others. Memory devices are utilized as non-volatile memory for a wide range of electronic applications in need of high memory densities, high reliability, and data retention without power. Non-volatile memory may be used in, for example, personal computers, portable memory sticks, solid state drives (SSDs), digital cameras, cellular telephones, portable music players such as MP3 players, movie players, and other electronic devices. Various resistive memory devices can include arrays of cells organized in a cross-point architecture. In such architectures, the memory cells can include a cell stack comprising a storage component, for example, a phase change element, in series with a select device, for example, a switching element such as an ovonic threshold switch (OTS) or diode, between a pair of conductive lines, for example, between an access line and a data/sense line. The memory cells are located at the intersections of two conductive lines, such as a word line and a bit line, and can be "selected" via application of appropriate voltages thereto.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

Figure 1:
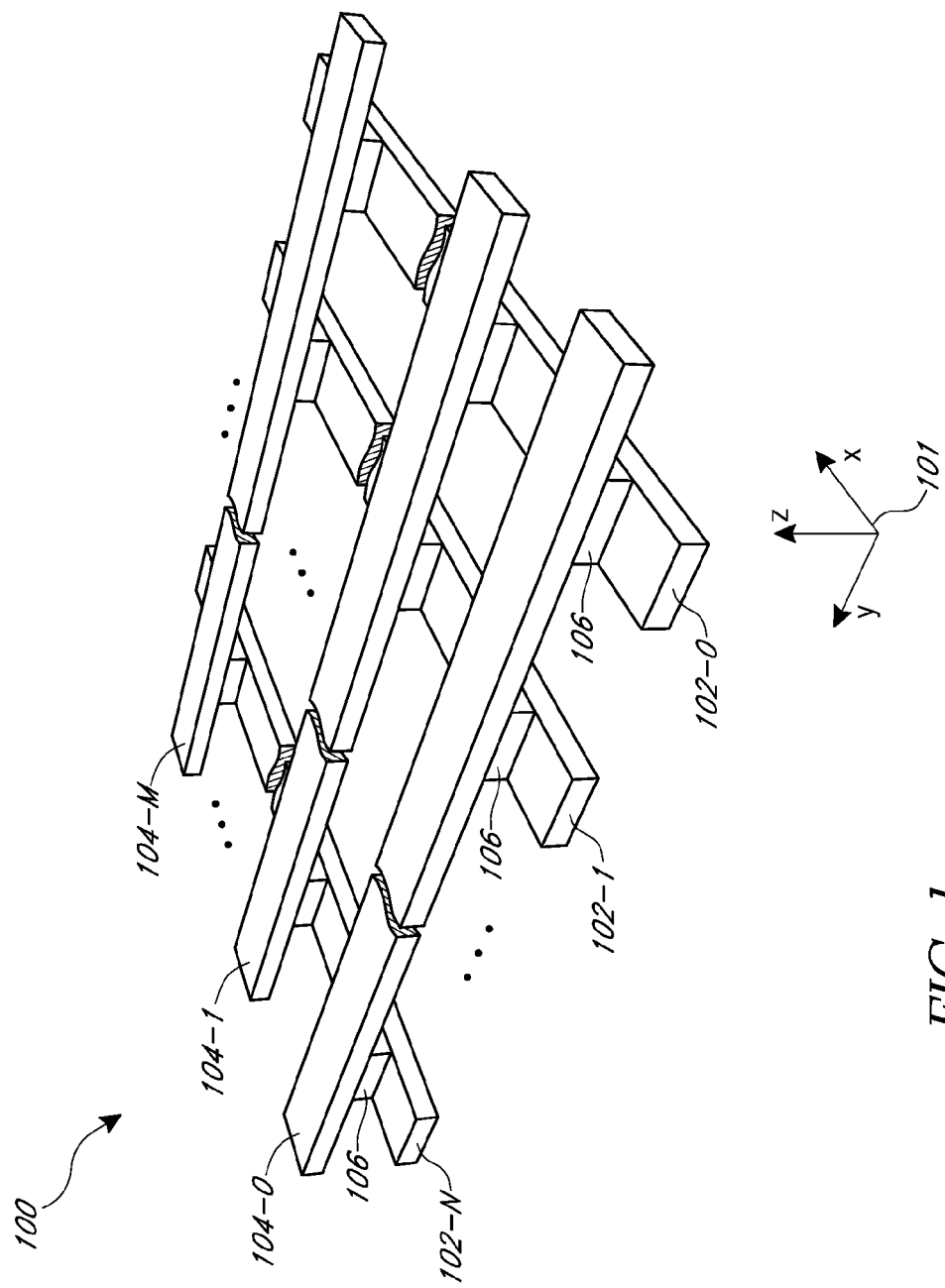
FIG. 1 is an illustration depicting a perspective view of a portion of an example memory array of a memory tile.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized. Furthermore, structural and/or logical changes may be made without departing from the scope of claimed subject matter. It should also be noted that directions and/or references, for example, up, down, top, bottom, and so on, may be used to facilitate discussion of drawings and are not intended to restrict application of claimed subject matter. Therefore, the following detailed description is not to be taken to limit the scope of claimed subject matter and/or equivalents.

DETAILED DESCRIPTION

In the following detailed description, numerous specific details are set forth to provide a thorough understanding of claimed subject matter. However, it will be understood by those skilled in the art that claimed subject matter may be practiced without these specific details. In other instances, methods, apparatuses and/or systems that would be known by one of ordinary skill have not been described in detail so as not to obscure claimed subject matter.

Overview

Memory devices may utilize memory tiles comprising cross-point arrays to efficiently store and retrieve data. These memory devices can include multiple memory tiles where one memory tile array comprises multiple storage components, such as thousands of storage components, arranged in an array structure. Each memory tile may include a cross-point array and be defined by a set of addresses where one address uniquely identifies one storage component of the memory tile. Storage components of memory tiles can be selected from the memory tiles by applying voltages to digit line conductors and access line conductors corresponding to individual storage components. The selected storage component may then be accessed by an access circuit associated with the storage component.

Unfortunately, many cross-point arrays in memory tiles suffer from disturb effects. Disturb effects may include effects where selecting and/or accessing one storage component of a cross-point array negatively impacts a memory device's ability to successfully select and/or access the storage components of the same cross-point array within a subsequent time period or access event. For example, when storage components of cross-point arrays are formed in part of chalcogenide, the cross-point arrays can exhibit a threshold recovery effect such that selection of a storage component of one cross-point array impedes the selection of the storage components connected to the same digit or access line conductor of the same cross-point array until the threshold of the storage component has recovered substantially to an initial threshold value. The state of a previously selected storage component may have to transition from a selected level to a de-selected level and remain in the deselected state for a time period before the storage components connected to the same digit or access line conductor can be successfully selected. As another example of a disturb effect, the selection of a storage component of one cross-point array may result in coupling effects with other storage components and/or digit or access line conductors of the same cross-point array that are within a distance of the selected storage component or and/or digit or access line conductors. The coupling effects can result in improper selection of storage components or incorrect accesses of the storage components. As a further example of a disturb effect, the selection of a storage component may induce a localized, temporary increase in temperature. This temperature increase can affect proper selection and operation of one or more storage components.

To manage disturb effects in the cross-point arrays of memory tiles, some memory devices select and access one storage component of one memory tile and then move onto select and access one storage component of a different memory tile. These memory devices continue consecutively (for example, as result of consecutive one or more clock pulses) selecting and accessing one storage component of multiple different memory tiles until eventually returning to access the storage components of a previously accessed memory tile. This approach, however, may limit the efficiency and performance of memory devices since transitioning from selecting and accessing one memory tile to a next can create overhead (such as, the use of additional circuit components) and memory access latency. Moreover, transitioning from selecting and accessing one memory tile to a next may consume energy.

Accordingly, in some embodiments of the present disclosure, a selection and access sequence is provided that enables consecutive (such as, as result of one or more consecutive clock pulses) selections and accesses within a single memory tile. The selection and access sequence facilitates high performance memory device operations (for example, sensing, reset pulses, pre-condition pulses, and the like) by ordering the selection and access of storage components of the single memory tile along a nonadjacent pattern, for example, such as a diagonal pattern. The selection and access sequence can be chosen to achieve full coverage of a single memory tile while accounting for disturb effects resulting from selecting and accessing of individual storage components. Adjacent locations of the single memory tile may be selected and accessed after a latency period due to disturb effects has passed.

In other embodiments of the present disclosure, an apparatus, such as a memory device, is disclosed. The apparatus includes multiple memory tiles and selection circuitry. Each memory tile has an array of storage components at intersections of a plurality of digit line conductors and a plurality of access line conductors. The selection circuitry includes line drivers that select a storage component of a memory tile based on a corresponding digit line conductor and a corresponding access line conductor to the storage component. The selection circuitry may select two or more storage components of a memory tile in a consecutive manner before selecting the storage components of a different memory tile. In some implementations, the storage components of the different memory tile can be selected in parallel with selection of the two or more storage components of the memory tile.

In further embodiments of the present disclosure, an apparatus, such as a memory device, includes a controller and a memory configured to store memory addresses. The controller switches multiple switching devices to select a storage component of multiple memory tiles according to a memory address associated with a digit line conductor and an access line conductor for the storage component. Each memory tile has an array of uniquely addressable storage components at intersections of a plurality of digit line conductors and a plurality of access line conductors. The controller determines a next memory address to select with the multiple switching devices based at least partly on a previously selected memory address and stores the next memory address in the memory. The controller can select two or more storage components of a memory tile consecutively before selecting the storage components of a different memory tile.

In yet other embodiments of the present disclosure, a method of operating a memory device is disclosed. The method includes determining memory addresses of storage locations of a memory tile of multiple memory tiles. Each of the memory addresses has a corresponding digit line conductor and a corresponding access line conductor, and each memory tile includes an array of storage components at intersections of a plurality of digit line conductors and a plurality of access line conductors. In addition, the method includes selecting the corresponding digit line conductors and the corresponding access line conductors to the determined memory addresses of the storage locations to access the storage locations of the memory tile. At least two or more storage components of a memory tile can be selected before selecting the storage components of a different memory tile.

System Overview

Integrated circuits, such as integrated circuit memory devices, include multiple layers of material typically built on a substrate. The material layers include conductive metal layers, also known as metal levels, which interconnect circuit devices. Elongate conductive lines of metal levels in an integrated circuit include interconnects as well as electrode that function as electrodes for semiconductor devices (for example, access lines and digit lines for addressing memory cells, which can include switches and/or memory storage components—access lines and digit lines can also be referred to as word lines and bit lines). Conductive lines formed from a layer or layers at the same vertical level can be referred to collectively as a metal level, and the lines can be referred to metal lines or wires, even though the material may be formed from non-metal conductors such as doped semiconductor layers (for example, polysilicon) or metallic alloys such as metal nitrides, metal carbides and metal silicides. Contacts formed between metal levels can be referred to as vertical connectors. Such vertical connectors can be formed separately from the conductive lines they connect, or can be simultaneously formed with overlying conductive lines in a dual damascene process.

References herein to memory "bit lines" are more generally applicable to digit lines that are not limited to binary memory storage. Furthermore, bit lines can be referred to as column electrodes, and references to bit line drivers and driver regions herein are applicable to column drivers and driver regions. Similarly, access or word lines can be referred to as row electrodes, and references herein to word line drivers and driver regions are applicable to row drivers and driver regions. The skilled artisan will appreciate that row column electrodes need not be perpendicular; rather, an array can be configured in a manner in which the row and column electrodes cross one another at non-perpendicular angles.

A memory device may include memory cells arranged in an array format. A memory array generally may include two conductive, or semi-conductive, crossing (for example, orthogonal) lines referred to as an access line (for example, word line) and a digit line (for example, bit line) that are used to select a memory cell to access (for example, program and read) the memory cell. The word lines and bit lines can also serve as electrodes for the memory cells and so can be referred to as electrode lines, or more simply as electrodes. Although different types of memory cells may be accessed in different manners, word lines and bit lines are typically coupled to respective word line and bit line driver circuitry, also known as row and column drivers. As used herein, the term "substrate" may include silicon-on-insulator (SOI) or silicon-on-sapphire (SOS) technology, doped and undoped semiconductors, epitaxial layers of silicon supported by a base semiconductor foundation, complementary metal oxide semiconductors (CMOS), for example, a CMOS front end with a metal back end, and/or other semiconductor structures and technologies. Various circuitry, such as decode circuitry, for example, associated with operating memory array may be formed in and/or on the substrate.

FIG. 1 illustrates a perspective view of a portion of a memory array 100 of a memory tile. In this example, array 100 may comprise a cross-point array including memory cells 106 positioned at intersections of a first set of conductive lines 102-0, 102-1, . . . , 102-N, for example, access lines, which may be referred to herein as word lines, and a second set of conductive lines 104-0, 104-1, . . . , 104-M, for example, data lines, which may be referred to herein as bit or digit lines. Coordinate axis 101 indicates that the bit lines 104-0, 104-1, . . . , 104-M are oriented in an y-direction and the word lines 102-0, 102-1, . . . , 102-N are oriented in a x-direction, in this example. As illustrated, the word lines 102-0, 102-1, . . . , 102-N are substantially parallel to each other and are substantially orthogonal to the bit lines 104-0, 104-1, . . . , 104-M, which are substantially parallel to each other; however, embodiments are not so limited, and word lines and bit lines can have non-perpendicular orientations. As used herein, the term "substantially" intends that the modified characteristic needs not be absolute, but is close enough so as to achieve the advantages of the characteristic. For example, "substantially parallel" is not limited to absolute parallelism, and may include orientations that are at least closer to a parallel orientation than a perpendicular orientation. Similarly, "substantially orthogonal" is may include orientations that are closer to a perpendicular orientation than a parallel orientation. Further, in some implementations, a cross-point array can be oriented in a vertical direction such that bit lines and word lines may lie on a plane perpendicular or substantially perpendicular to the plane of the substrate.

Cross-point array 100 may comprise an array structure. As an example, memory cells 106 may comprise phase change random access memory (PCRAM) cells, resistive random access memory (RRAM) cells, conductive bridge random access memory (CBRAM) cells, and/or spin transfer torque random access memory (STT-RAM) cells, among other types of memory cells. In various embodiments, memory cells 106 may comprise a "stack" structure that includes a select device, for example, a switching device, coupled in series to a storage component, for example, a resistive storage component comprising a phase change material or metal oxide. As an example, the select device may comprise a diode, a field effect transistor (FET), a bipolar junction transistor (BJT), or an ovonic threshold switch (OTS), among other switching elements.

In a number of embodiments, a select device and storage component associated with a respective memory cell 106 may comprise series coupled two-terminal devices. For instance, a select device may comprise a two-terminal Ovonic Threshold Switch (OTS), for example, a chalcogenide alloy formed between a pair of electrodes, and the storage component may comprise a two-terminal phase change storage component, for example, a phase change material (PCM) formed between a pair of electrodes. In a number of embodiments, an electrode may be shared between a select device and a storage component of a memory cell 106. Also, in a number of embodiments, the bit lines 104-0, 104-1, . . . , 104-M and the word lines 102-0, 102-1, . . . , 102-N may serve as top and bottom electrodes corresponding to the memory cells 106.

As used herein, "storage component" or "storage element" may refer to a programmable portion of a memory cell 106, for example, the portion programmable to different data states. For instance, in PCRAM and RRAM cells, a storage component may include a portion of a memory cell having a resistance that is programmable to particular levels corresponding to particular data states responsive to applied programming signals, for example, voltage and/or current pulses. A storage component may include, for example, one or more resistance variable materials, such as a phase change material. As an example, a phase change material may comprise a chalcogenide alloy such as an indium(In)-antimony (Sb)-tellurium(Te) (IST) material, for example, $In_2Sb_2Te_5$, $In_1Sb_2Te_4$, $In_1Sb_4Te_7$, etc., or a germanium(Ge)-antimony (Sb)-tellurium(Te) (GST) material, for example, $Ge_8Sb_5Te_8$, $Ge_2Sb_2Te_5$, $Ge_1Sb_2Te_4$, $Ge_1Sb_4Te_7$, $Ge_4Sb_4Te_7$, etc., among other phase change materials. The hyphenated chemical composition notation, as used herein, indicates the elements included in a particular mixture or compound, and is intended to represent all stoichiometries involving the indicated elements. Other phase change materials can include Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, for example. Other examples of resistance variable materials may include transition metal oxide materials and/or alloys including two or more metals, for example, transition metals, alkaline earth metals, and/or rare earth metals. Embodiments are not limited to a particular resistive variable material or materials associated with the storage components of the memory cells 106. For instance, other examples of resistive variable materials that may be used to form storage components include binary metal oxide materials, colossal magneto-resistive materials, and/or various polymer-based resistive variable materials, among others. Moreover, in some implementations, a "storage component" can further include a selection device incorporated into a memory cell. Although not illustrated in FIG. 1, in a number of embodiments, array 100 may be implemented as part of a three dimensional (3D) architecture, with a number of arrays 100 vertically stacked on each other, for example, or with a number of arrays 100 stacked side-to-side on a plane perpendicular to the plane of the substrate.

Further, as used herein, a "memory tile" or "tile" may refer to one or more cross-point arrays that include a group of a finite number of memory cells having a corresponding set of memory cell addresses in which each memory cell of the group is can be individually addressed. For example, for a single level cell memory, one memory cell address may be used to select and access one memory cell of the group. For multiple level cell memory, a memory cell can hold more than one bit of data, and while each cell may correspond to a unique physical address, more than one logical address can apply to an individual cell. In one example, a memory tile may be defined by a word line that is 1 k bits in extent and a bit line that is 1 k bits in extent. The tile encompasses the set of memory cells that are uniquely addressable by the group of drivers used to drive the selectable 1K×1K bits. The tile accordingly can include a matrix of individually-addressable memory elements that can be selected for data operations (for example, read and write) at a granularity as small as a single memory element. It will be noted that a tile does not necessarily correspond to the physical boundaries of drivers, sockets, or electrodes. Drivers and sockets can be distributed and electrodes can overlap such that there is not a physical contiguous boundary that encloses the driver group location and location of a corresponding driven memory cell array.

Figure 2:
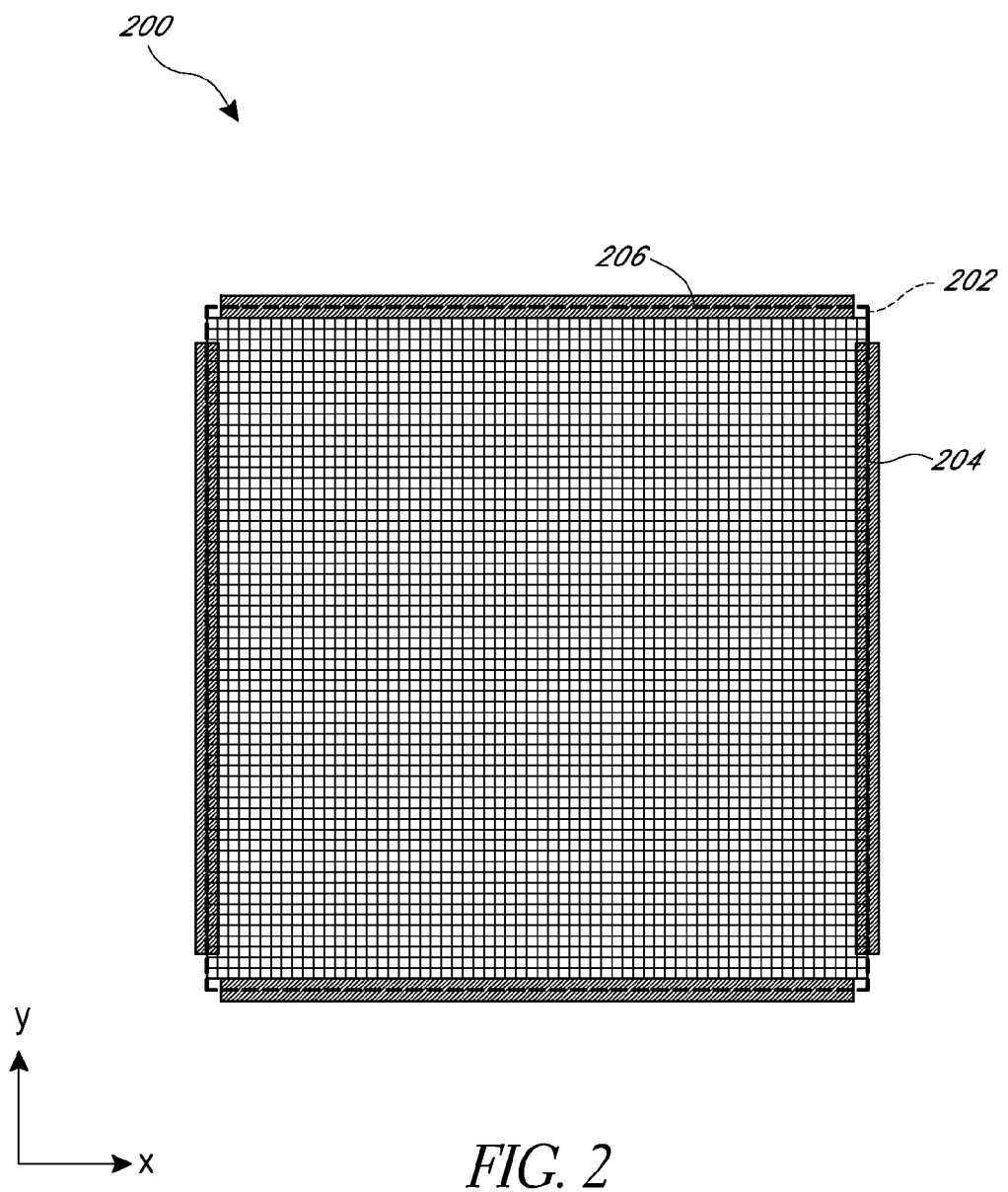
FIG. 2 is an illustration depicting socket regions for connecting word and bit lines to their drivers at edges of an example memory array.

FIG. 2 is a simplified plan view of a memory array architecture 200 where word line drivers 204 are located substantially within a footprint of a memory array 202, for example, under memory cells, and near a periphery of the array. The array 202 is outlined in FIG. 2 by the dashed outline. Bit line drivers 206, conversely, are located generally outside of the footprint of the array 202. The set of drivers 204 or 206 is located near the edge of the array 202 in two contiguous blocks of circuitry on opposite sides of the array 202. The array 202 may illustrate a memory tile, in some embodiments, while the array 202 can illustrate a portion of a tile, such as a patch of a tile, in other embodiments. Moreover, one or more access circuits (not shown) can be associated with the memory cells of the array 202 to access selected memory cells. Those skilled in the art will appreciate that circuit details of the array and driver circuitry is not provided in order to focus the description on the general layout of the architecture.

Figure 3:
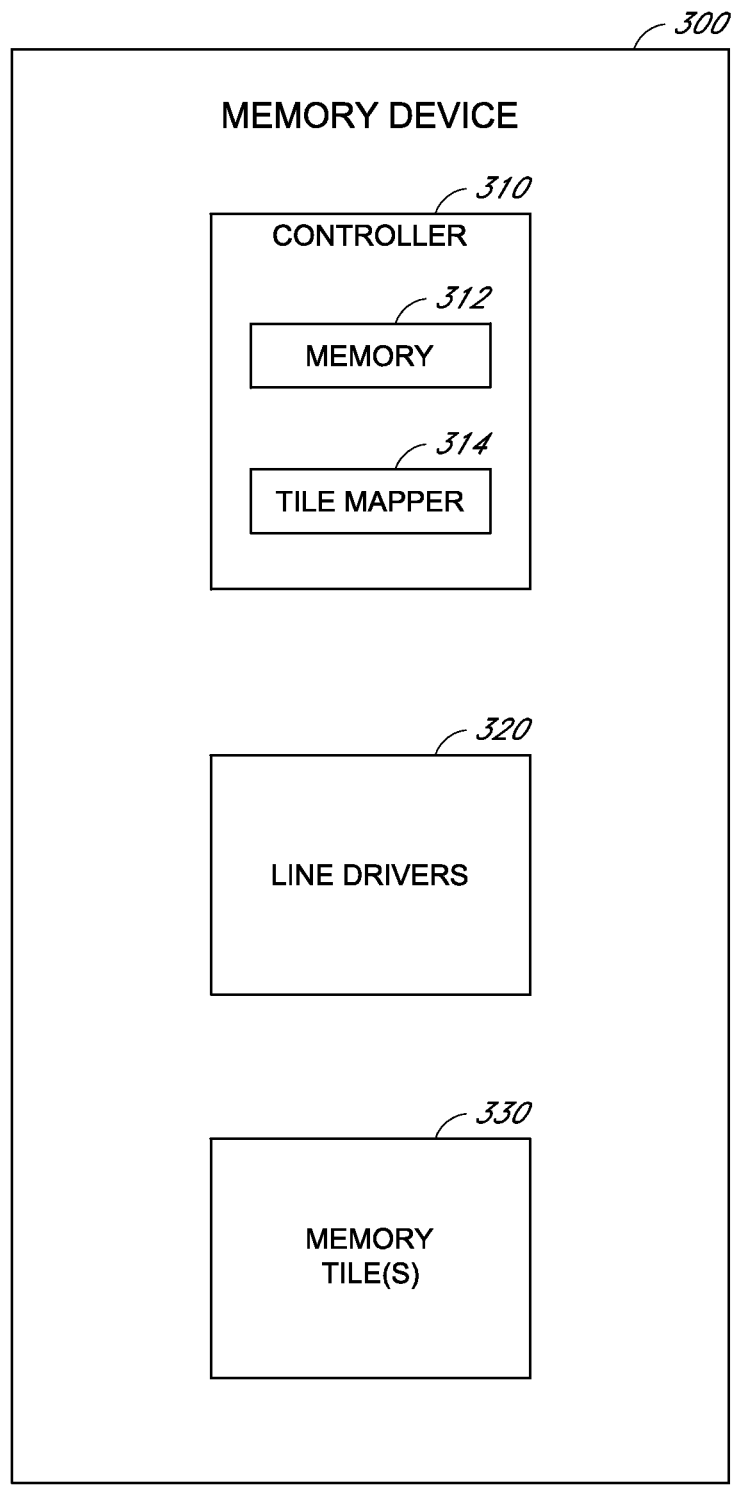
FIG. 3 is an illustration depicting a block diagram of an example memory device.

FIG. 3 is an illustration depicting a block diagram of an example memory device 300. The memory device 300 includes a controller 310, line drivers 320, access circuits 330, and memory tiles 340. The memory device 300 can be configured to access multiple memory cells of a single memory tile before accessing memory cells of a different memory tile. For instance, memory device 300 may implement one or more selecting and accessing approaches or sequences discussed in this disclosure.

The controller 310 manages selecting and accessing of memory cells of the memory tiles 340. The controller 310 can determine storage addresses of the memory tiles 340 to access where the storage addresses correspond to particular physical memory cells of the memory tiles 340. The controller 310 can transmit address selection signals indicative of the storage addresses to the line drivers 320 to select particular physical memory cells. In addition to the address selection signals, the controller 310 may transmit to the access circuits 330 access instructions, such as whether to read or program memory cells, and accompanying data to be written to the selected memory cells. In response to the access instructions and address selection signals, the controller 310 can receive confirmation of successful selecting and/or accessing of the memory cells or data accessed from the selected memory cells.

A memory 312 can be used by the controller 310 to store addresses. The memory 312 may contain one or more previously selected storage addresses or one or more next storage addresses to be selected by the controller 310. The controller 310 can store addresses in the memory 312 to facilitate transmission of the address selection signals through the line drivers 320 and determination of next address addresses to select and access based on one or more previously selected and accessed addresses. In some implementations, the memory 312 stores a look-up table that includes a sequential list of storage addresses, providing a selection and access sequence for one or more memory tiles. Additionally, although the memory 312 is part of the controller 310 in the illustrated embodiment, the memory 312 may be separate from the controller 310 in some implementations.

Figure 7:
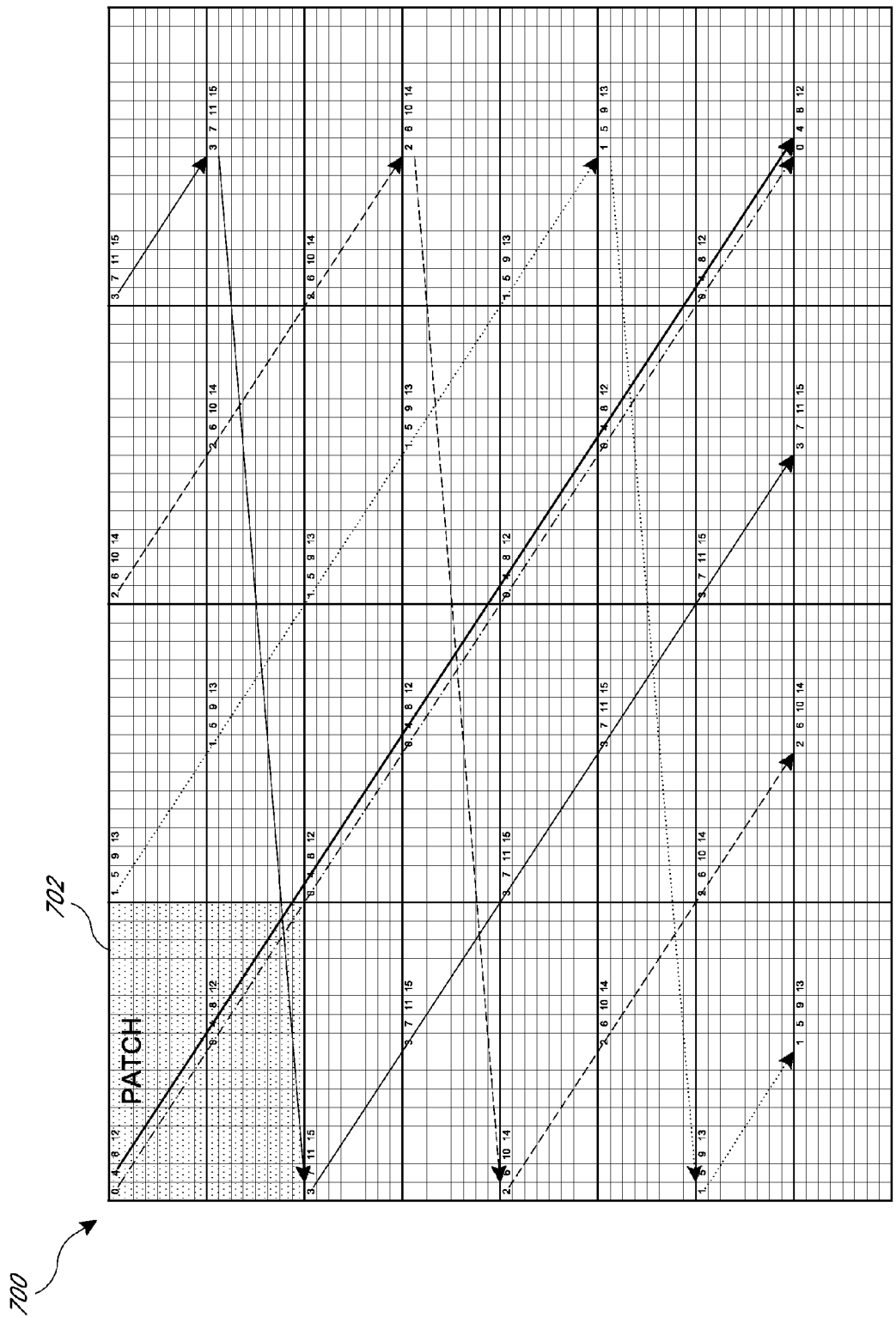
FIG. 7 is an illustration depicting an example access pattern for selecting and accessing memory locations of a memory tile.
Figure 8:
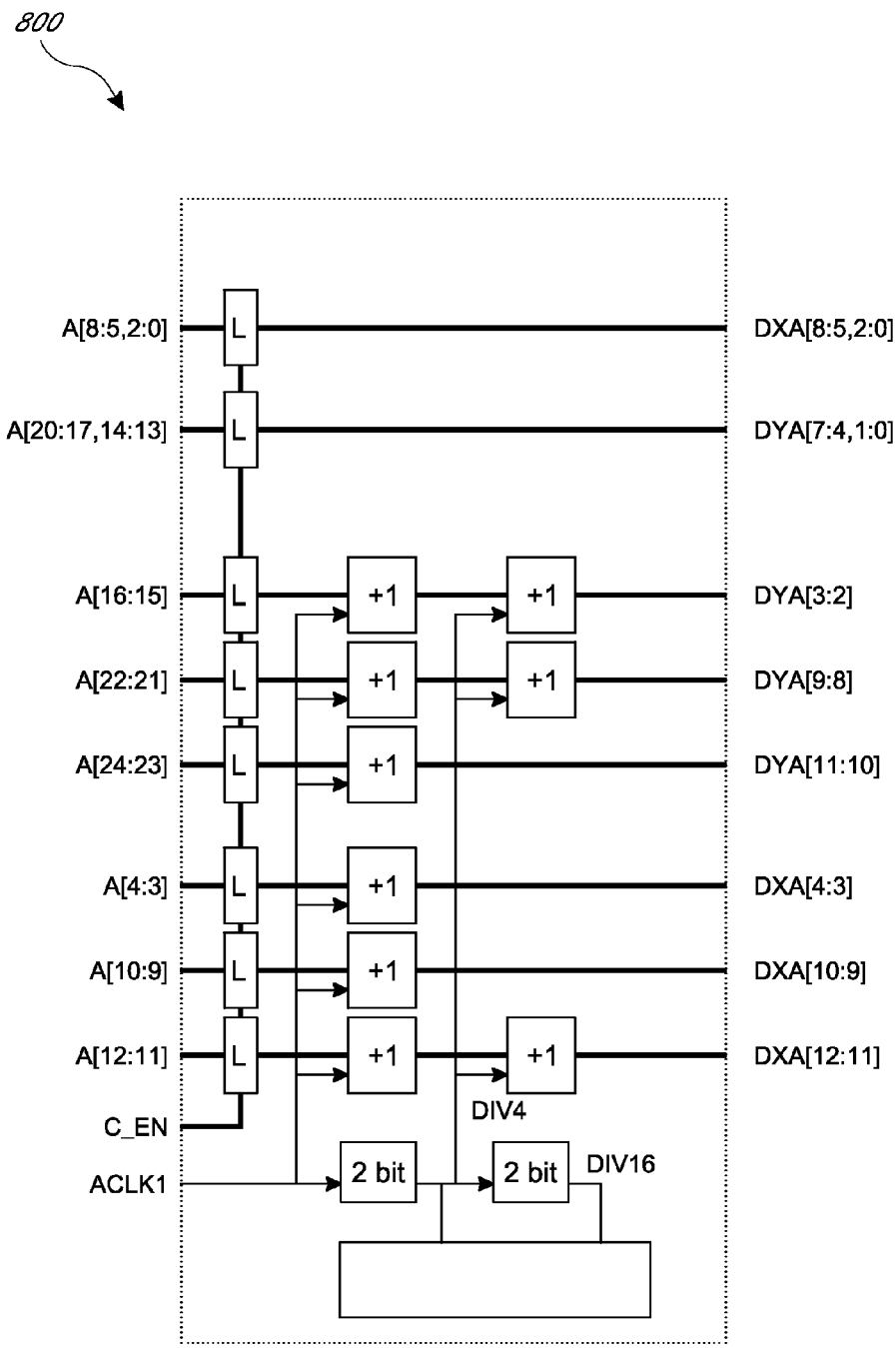
FIG. 8 is an illustration depicting a tile mapper or sequencer 800 for converting addresses from one address space to another address space.

The controller 310 further includes an optional tile mapper 314, such as the tile mapper 800 described with respect to FIG. 8. The tile mapper 314 can be circuit used by the controller 310 to map input storage addresses to a next storage address. The tile mapper 314 can generate addresses in accordance with an access pattern as discussed with respect to FIGS. 6 and 7, for instance.

Memory Tile Location Selection and Access

Figure 4:
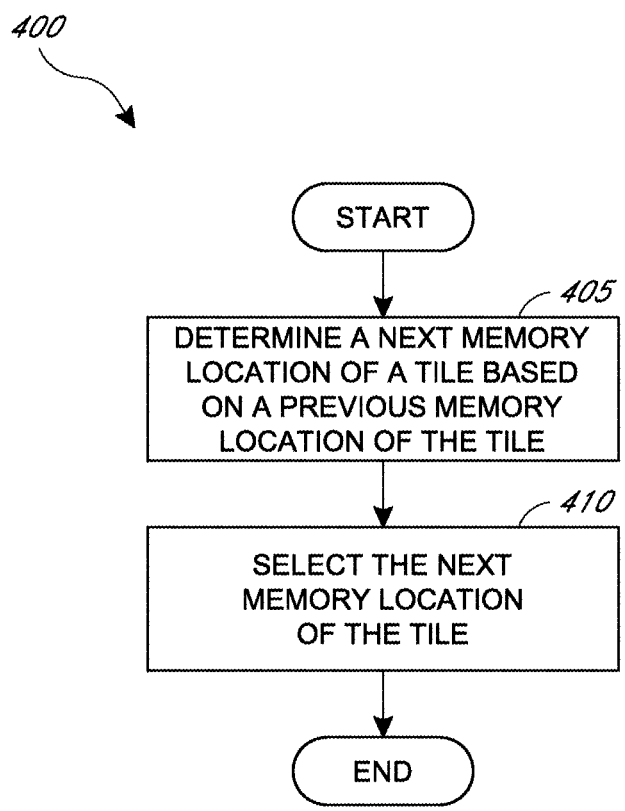
FIG. 4 is an illustration depicting an example process for selecting memory locations of a memory array.

FIG. 4 is an illustration depicting an example process 400 for selecting memory locations of a memory array including a cross-point array. The process 400 can be performed by the controller 310, line drivers 320, and/or access circuits 330 on the memory tiles 340, for example. The process 400 can enable a memory device to consecutively select and access memory cells of a single memory tile before selecting and accessing memory cells of the different memory tile.

At block 405, a next memory location of a memory tile is determined based on a previous memory location of the tile. The previous memory location may have been previously selected and accessed by the controller 310, line drivers 320, and/or access circuits 330. The selection and access of the previous memory location may have caused disturb effects for one or more of the memory locations of the memory tile for a following disturb period. Accordingly, the next memory location can be determined by the controller 310 as a memory location of the memory tile that can be successfully selected and accessed at one or more times during this disturb period. For example, the next memory location can be a location of the memory tile having a different corresponding digit and access line conductor from the previous memory location. Moreover, the next memory location may be a memory location that is non-adjacent to the previous memory location in the array of memory locations of the memory tile. In some implementations, the next memory location is determined according to one or more disturb effect recovery times for the memory locations of the tile. For instance, the next memory location can be determined based on a threshold recovery time for the memory locations of the tile such that memory locations having the same corresponding digit or access line conductors are selected after expiration of the threshold recovery time. As another example, the next memory location can be determined according to a distance affected by coupling effects resulting from selection and access of the previous memory location. The next memory location can be determined to have a sufficient distance from the previous memory location or the digit or access line conductors of the previous memory location (for example, 5, 10, or 20 line conductors) such that the next memory location can be successfully selected and accessed.

At block 410, the next memory location of the tile is selected, for example by the controller 310 using the line drivers 320. The next memory location can be selected during one or more next clock cycles of the memory device and within the disturb period when selection and access of the previous memory location continues to cause or suffer from disturb effects for some memory locations of the tile. The next memory location, however, can be successfully selected and accessed for a data operation, such as a read or write operation, since the previous and next memory locations, corresponding digit and access line conductors, and/or access circuits of the previous and next memory locations are separated from each other by a distance such that disturb effects from selecting and accessing the memory locations do not disrupt successfully selecting and accessing both memory locations.

Figure 5:
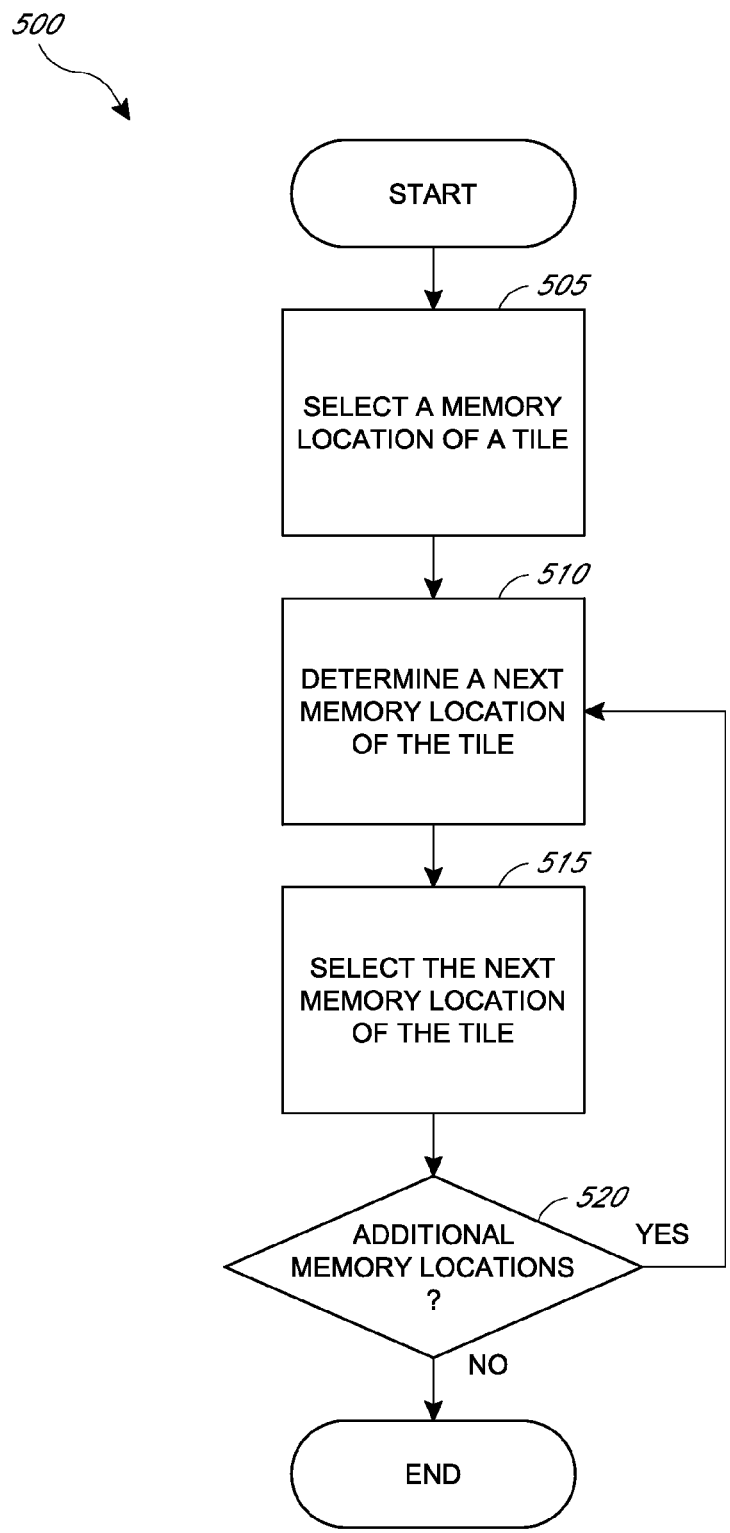
FIG. 5 is an illustration depicting another example process for selecting memory locations of a memory array.

FIG. 5 is an illustration depicting another example process for selecting memory locations of a memory array including a cross-point array. The process 500 can be performed by the controller 310, line drivers 320, and/or access circuits 330 on the memory tiles 340, for instance. The process 500 can enable a memory device to consecutively select and access memory cells of a single memory tile before selecting and accessing memory cells of the different memory tile.

At block 505, a memory location of a memory tile is selected, for example using the controller 310 and/or line drivers 320. The memory location, such as an initial memory location, can be selected and accessed for data operations, such as read or write operations. Selection of the memory location may cause one or more disturb effects for some memory locations of the memory tile for a following disturb period.

At block 510, a next memory location of the tile is determined, for instance using the controller 310. This determination can account for the disturb effects caused by selection and access of one or more previously selected memory locations. The next memory location can be a memory location that if selected and accessed during one or more disturb periods for previously selected and accessed memory locations of the tile, its corresponding digit and access line conductors, access circuits, and memory location would not be subject to the disturb effects that prevent successfully selecting and/or accessing the memory location. In some embodiments, the next memory location is determined based at least in part on one or more of a technique used for sensing or writing the memory locations of the tile and the biasing levels for memory locations of the tile. Further, the next memory location may, in some cases, be chosen from a range or group of memory locations that can be successfully selected and accessed. In other cases, the next memory location may be chosen according to a selection and access pattern, such as a selection and access pattern provided by the tile mapper 314 or a look-up table stored in the memory 312.

At block 515, the next memory location of the tile is selected, for example using the controller 310 and/or line drivers 320. The next memory location can be selected during one or more next clock cycles of the memory device and within the disturb period when selection and access of one or more previous memory locations continues to cause or suffer from disturb effects for some memory locations of the tile. The next memory location, however, can be successfully selected and accessed for a data operation, such as a read or write operation, since the one or more previously selected and accessed memory locations and the next memory location and/or corresponding digit and access line conductors and access circuits of the memory locations are separated from each other such that the disturb effects from selecting and accessing the one or more previous memory locations do not disrupt successfully selecting and accessing the next memory location.

At block 520, a decision is made whether one or more additional memory locations of the tile should be processed, for instance by the controller 310. In some embodiments, a selection and access pattern is used to determine a percentage or all of the memory locations of the tile that are processed. Until the percentage or all of the memory locations are processed, the process 500 continues to return to block 510 and determine a next memory location of the tile. Once the percentage or all of the memory locations are processed, the process 500 ends. In some embodiments, a memory access request is used to determine the memory locations of the tile that are processed. Until a number of or particular requested memory locations are processed, the process 500 continues to return to block 510 and determine a next memory location of the tile. Once the number of or particular requested memory locations are processed, the process 500 ends.

Figure 6:
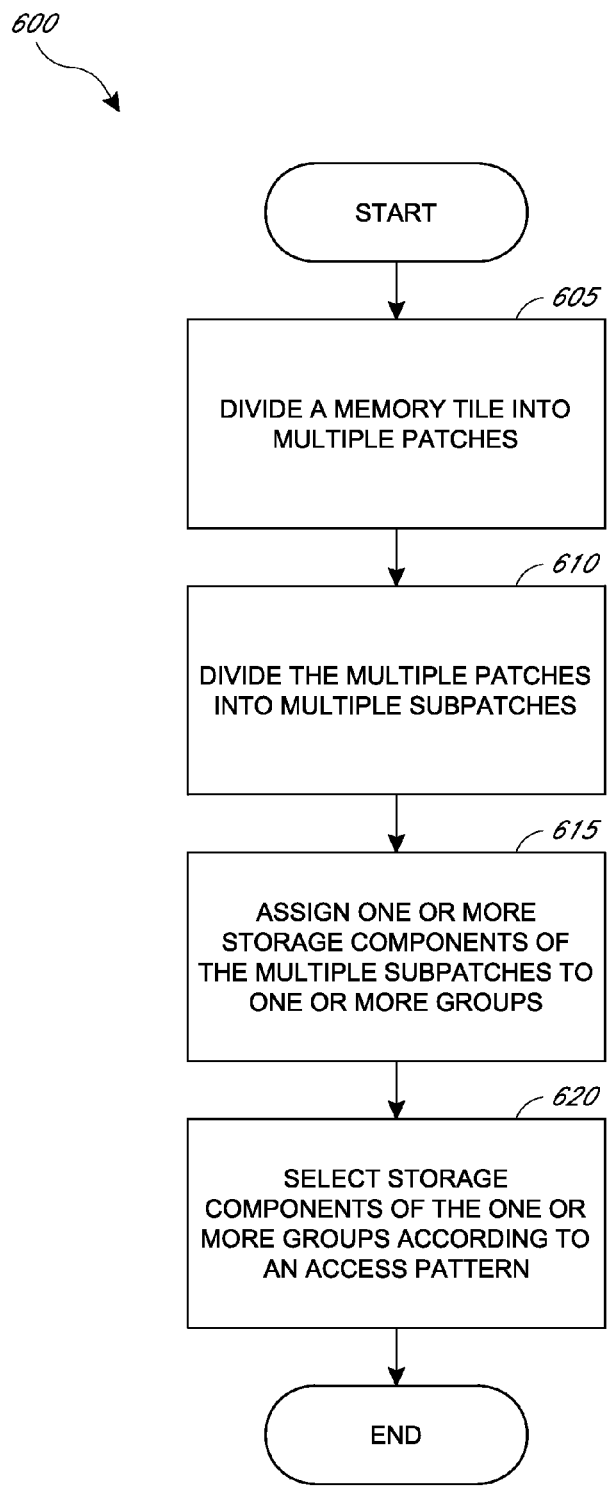
FIG. 6 is an illustration depicting a process for selecting memory locations of a memory array according to an access pattern.

FIG. 6 is an illustration depicting a process for selecting memory locations of a memory array according to an access pattern. The process 600 can be performed by the controller 310, line drivers 320, and/or access circuits 330 on the memory tiles 340, for instance. The process 600 can enable a memory device to consecutively select and access storage components of a single memory tile before selecting and accessing storage components of the different memory tile.

At block 605, a memory tile is divided into multiple patches. For example, the tile may be divided into $2^N$ different patches where N is a positive integer number and each patch includes an equal number of storage components. In some implementations, the tile can be divided into any integer number patches greater than one, and some patches may include greater or fewer storage components than other patches. The dividing may be performed by the controller 310, the tile mapper 314, or determined according to a look-up table stored in the memory 312, for instance.

At block 610, the multiple patches are divided into multiple subpatches. For example, one or more patches can be divided into $2^M$ different subpatches where M is a positive integer number. In some implementations, the tile can be divided into any integer number subpatches greater than one, and some subpatches may include greater or fewer storage components than other subpatches. The dividing may be performed by the controller 310, the tile mapper 314, or determined according to a look-up table stored in the memory 312, for instance.

At block 615, one or more of the storage components of the multiple subpatches are assigned to one or more groups. For example, some storage components located in a common physical location of the subpatches can be assigned to one group, and the other storage components located in the common physical location of the subpatches can be assigned to a different group. The storage components can be assigned to groups such that the storage components of one group can be selected and accessed immediately after one another without disturb effects from selecting and accessing one storage component impacting successfully selecting and accessing the other storage components. In other examples, the storage components can be assigned to groups using other schemes such as randomly by the controller 310 or according to assignments from a lookup table stored in the memory 312. Further, the groups can be further assigned to a sequence of groups or one or more time intervals such that an order for the selection and access of different groups can be determined. This selection and access may, as a result, be performed in the way that the disturb effects from selecting and accessing the storage components of one group do not impact successfully selecting and accessing the storage components of a next consecutive group. In addition, in some embodiments, the storage components are assigned to groups by assigning one or more memory addresses or corresponding digit and/or access line conductors to groups so that the storage components are assigned to groups.

At block 620, the storage components of one or more groups are selected according to an access pattern, for instance by the controller 310 and/or line drivers 320. The access pattern can depend on the assignment of the one or more storage components to the one or more groups. For example, the storage components of some groups can be selected in a consecutive manner (for example, as result of one or more consecutive clock pulses) before or after the storage components of other groups. The storage components of a first group can be consecutively individually selected. After the storage components of the first group have been selected, the storage components of a second group are individually consecutively selected. After the storage components of the second group of been selected, one or more further groups can be selected in the same fashion. Selection of the storage components using the access pattern can result in selection of the storage components having various relationships to one another in the array of storage components of the memory tile. For instance, some storage components that are equidistant from one another and/or along a diagonal of the array can be selected consecutively. Moreover, in some implementations, the slope of the diagonal of the selection pattern (for example, the slope can refer the slope of a line joining two or more consecutively selected storage components) can vary depending on a desired delay and distance in the consecutive selection of storage components of the tile. For instance, the slope of a selection pattern may be 2 signifying that the distance or jump between consecutively selected access lines is twice the distance or jump as between consecutively selected digit lines. That is, a next storage component selected along the slope from a previously selected storage component may be K positions away along the digit line and 2·K positions away along the access line from the previously selected storage component. In other examples, the slope of the selection pattern can be ¼, ⅓, ½, 1, 2, or 3, 4, and the like. In FIG. 7, a selection pattern is illustrated having a slope of 1 between some consecutive accesses.

Selection and Access Pattern Embodiment

FIG. 7 is an illustration depicting an example access pattern for selecting and accessing a collection 700 of memory addresses of a memory tile. In the example of FIG. 7, each square of the collection 700 represents a memory address of a corresponding storage component of the tile. The collection 700 includes 4,096 different memory addresses corresponding to 4,096 storage components selectable by the drivers for the tile. The memory addresses are divided into 16 equal-sized patches. Each patch accordingly corresponds to 256 selectable memory addresses. Patch 702 is shaded. Each patch is further divided into four equal-sized subpatches (for example, a top-left, top-right, bottom-left, and bottom-right corner subpatch) corresponding to 64 storage components. The top two subpatches of a patch have a shared access circuit for accessing the storage components corresponding to the top two subpatches, and the bottom two subpatches of the patch have a different shared access circuit for accessing the corresponding storage components to the bottom two subpatches. Each memory address along one row of the collection 700 may share a common access line, while each memory address along one column of the collection 700 may share a common digit line. Although the collection 700 includes memory addresses for 4,096 storage components divided into 16 equal-sized patches, in other cases, the collection of memory addresses for tiles may be smaller or larger and, for instance, may instead select tens of thousands or millions of storage components. In such other cases, similar assignment, selection, and access approaches to those discussed with respect to FIG. 7 also apply.

Some squares of the collection 700 are numbered with a number between 0 and 15. The number of the squares can correspond to an assigned grouping of the memory addresses, as discussed with respect to block 615 of FIG. 6. The storage components can be grouped such that the storage components of one group can be selected and accessed consecutively after one another (for example, one storage component per clock cycle or per multiple clock cycles) without disturb effects from selecting and accessing one storage component of the group impacting or being impacted by successfully selecting and accessing the other storage components of the same group. For example, the storage components of a group may have different corresponding digit and access line conductors and different access circuits from the other storage components of the group.

In FIG. 7, the squares labeled with the number 0 along the diagonal of the collection 700 may together form one group of storage components. The group of 0s includes eight squares from corresponding locations of some subpatches in the collection 700. In particular, a top-left square from the top-left and bottom-right subpatches of four different patches is included in the group of 0s. The squares labeled with the number 3 may together form a different group. The group of 3s includes squares from corresponding locations of some subpatches in the collection 700, including a top-left square from the top-left and bottom-right subpatches of four patches different from the four patches forming the group of 0s. The collection 700, in total, depicts 16 groups ranging from the group of 0s to the group of 15s. Although some squares of the collection 700 are not numbered for clarity of presentation, one or more of those squares can also be assigned to a group.

The groups of memory addresses of the collection 700 can provide an access pattern for selecting and accessing the corresponding storage components of the tile in the example of FIG. 7. For instance, according to a clock signal of a memory device, at time t=1, the storage component corresponding to the memory address in the top-left corner square of the collection 700 can be selected and accessed. The corresponding digit and access line conductors for the storage component can select the storage component, and the access circuit for the storage component can access (for example, read or write data) the storage component. When the clock increments to time t=2, a next storage component to select and access can be determined by following the dashed line to a next memory address of the group of 0s. In this example, the second memory address of the patch 702 that is in the group of 0s can be selected and accessed. When the clock increments to time t=3, a next storage component to select and access can be determined by again following the dashed line to a next memory address of the group of 0s.

This access pattern can be continued, following the dashed line and selecting and accessing the storage components corresponding to the next memory address in the group of 0s along the dashed line. When the clock increments to time t=8, the eight memory locations of the group of 0s have been selected and accessed. Then, when the clock increments to time t=9, a storage component of a different group may be selected, such as, for example, the storage component corresponding to a memory address in the group of 1s or 2s in the top row of the collection 700. The storage component of the different group can further be selected so that the disturb effects have passed from selecting and/or the same digit or access line conductor as a previously selected storage component of the group of 0s. At clock times t=10 through t=16, the storage components of the different group can be individually selected following the line and direction of the arrow after each clock cycle, before selecting and accessing the storage component of another group when the clock increments to time t=17. In addition, in some implementations, this access pattern along one line of FIG. 7 can be encoded using a counter (for example, a three bit count in this case since each line includes eight memory addresses). Moreover, in some embodiments, the memory addresses of a group can be accessed in an order different than starting with a memory address in a top row of subpatches of the collection 700, for example, by starting with a random memory address in the array.

The numbered squares of the collection 700 can further form one or more classes of groups. The classes of groups can be determined so that when different groups of a class are consecutively selected and accessed in a way that avoids disturb effects from selecting the same digit or access line conductors, the disturb effects from selecting and accessing the storage components of one group do not impact successfully selecting and accessing the storage components of another group. In some embodiments, the storage components of a class may have the same corresponding digit and access line conductors, but have different access circuits from one another.

For example, the memory addresses of the groups of 0s, 1s, 2s, and 3s can form one class. Similarly, the memory addresses of the groups of 4s, 5s, 6s, and 7s can form another class; the memory addresses of the groups of 8s, 9s, 10s, and 11s can form yet another class; and the memory addresses of the groups of 12s, 13s, 14s, and 15s can form still another class. From the clock cycles at times t=1 through t=8, the memory addresses of the group of 0s can be selected and accessed. From the clock cycles at times t=9 through t=16, the memory addresses of the group of is can be selected and accessed. Similarly, from the clock cycle times at times t=17 through t=24 and t=25 through t=32, the memory addresses of the groups of 2s and 3s can be selected and accessed, respectively. At clock cycle time t=33, the access pattern can transition from one class to another class. In one case, the storage components corresponding to the group of 4s can be next selected and accessed. In such a case, the latency between selecting and accessing storage components having the same corresponding digit or access line conductors is eight clock cycles, and the latency between selecting and accessing storage components that are adjacent to another previously selected storage component is 32 clock cycles. In another case, if more latency is desired between selection and access of adjacent storage components, the storage components corresponding to the group of 12s can next be selected and accessed, for instance. A memory device continuing this scheme can follow an access pattern that provides for full coverage of the memory addresses of the collection 700.

The assignment of memory addresses and corresponding storage components to groups and/or classes may depend in part on the technology or implementation used (for example, composition of the storage components, type of access circuit used, or dimensions/sizes of memory tiles, and the like). Moreover, the assignment of memory addresses and corresponding storage components can depend on disturb effects caused by the selection of a storage component of a memory tile and/or the access of a storage component of a memory tile. For example, for technology or implementations having disturb effects with a relatively longer duration, an access pattern can be used that provides a greater latency between (1) selections of a same digit or access line conductor and/or (2) accesses by the same access circuit.

FIG. 8 is an illustration depicting a tile mapper or sequencer 800 for converting addresses from one address space to another address space. The tile mapper 800 receives native tile selection addresses A as inputs (on the left) and outputs remapped addresses DXA and DYA (on the right) following an access pattern, such as the access pattern discussed in the example of FIG. 7. When enable C_EN is high, a native tile selection address $A_1$ can be passed through the L blocks to the DXA[8:5,2:0] output, DYA[7:4,1:0] output, and connected +1 blocks. In response to ACLK1 receiving a clock pulse of a clock signal, the +1 blocks (for example, adders or counters) can increment the received values from the connected L blocks or other +1 blocks, and the 2 bit blocks (for example, two-bit counters) can increment two-bit counts. The 2 bit blocks can be used to divide the frequency of the received clock signal by 4 (DIV4) after the first 2 bit block and by 16 (DIV16) after the second 2 bit block and to control certain components of the tile mapper 800, such as some +1 blocks.

As a result, using the tile mapper 800, a next memory addresses to select and access can be generated for a next selection and access of the memory tile based on a previously selected and accessed memory address. Thereby, the tile mapper 800 can be used by the controller 310, for example, to determine a selection and access sequence for a memory tile.

Conclusion

Systems including the memory devices described herein can additionally include one or more processors in communication with the logic circuitry of the memory devices. Such systems can additionally include components to define electronic devices, such as, but not limited to, computers, mobile phones, electronic games, cameras, music players, etc.

The terms, "and", "or", and "and/or" as used herein may include a variety of meanings that also are expected to depend at least in part upon the context in which such terms are used. Typically, "or" if used to associate a list, such as A, B or C, is intended to encompass A, B, and C, here used in the inclusive sense, as well as A, B or C, here used in the exclusive sense. In addition, the term "one or more" as used herein may be used to describe any feature, structure, or characteristic in the singular or may be used to describe a plurality or some other combination of features, structures or characteristics. Though, it should be noted that this is merely an illustrative example and claimed subject matter is not limited to this example.

In the preceding detailed description, numerous specific details have been set forth to provide a thorough understanding of claimed subject matter. However, it will be understood by those skilled in the art that claimed subject matter may be practiced without these specific details. In other instances, methods or apparatuses that would be known by one of ordinary skill have not been described in detail so as not to obscure claimed subject matter.

While there has been illustrated and described what are presently considered to be example features, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein.

Therefore, it is intended that claimed subject matter not be limited to the particular examples disclosed, but that such claimed subject matter may also include all aspects falling within the scope of appended claims, and equivalents thereof.

The invention claimed is:

1. An apparatus comprising:
a plurality of memory tiles including a first memory tile, each memory tile of the plurality of memory tiles comprising an array of storage components at intersections of a plurality of digit line conductors and a plurality of access line conductors; and
selection circuitry including line drivers configured to select a storage component of a memory tile of the plurality of memory tiles based on a corresponding digit line conductor and a corresponding access line conductor to the storage component,
wherein the selection circuitry is configured to consecutively select two or more storage components of the first memory tile before selecting a storage component of a different memory tile of the plurality of memory tiles, and
wherein the two or more selected storage components of the first memory tile have different corresponding digit line conductors and different corresponding access line conductors.

2. The apparatus of claim 1, wherein the two or more selected storage components of the first memory tile are non-adjacent to each other in the array of storage components of the first memory tile.

3. The apparatus of claim 1, wherein the two or more selected storage components of the first memory tile are separated from each other by a distance such that accessing data stored to one of the two or more storage components does not disrupt successfully accessing data stored to the other storage components of the two or more storage components.

4. The apparatus of claim 3, wherein the selection circuitry is configured to select the two or more storage components in the consecutive manner by selecting the storage components in response to consecutive clock pulses.

5. The apparatus of claim 1, wherein the selection circuitry is further configured to select the two or more storage components of the first memory tile based at least partly on a disturb effect recovery time for the storage components of the first memory tile.

6. The apparatus of claim 1, wherein the two or more selected storage components of the first memory tile include a first storage component, a second storage component, and a third storage component, the first storage component being separated from the second storage component by a distance and the second storage component being separated from the third storage component by the distance.

7. The apparatus of claim 1, further comprising access circuitry configured to access the storage components of the first memory tile, wherein the selection circuitry is further configured to select the two or more storage components of the first memory tile so that consecutively accessed storage locations of the first memory tile are along a diagonal from one another in the array of storage components of the first memory tile, the two or more storage components being accessible by different access circuitry.

8. The apparatus of claim 1, wherein the storage components comprise resistive memory elements having at least two resistive states.

9. The apparatus of claim 1, wherein each memory tile of the plurality of memory tiles is individually addressable based on an address programmed into the selection circuitry.

10. A method of operating a memory device, the method comprising:
determining memory addresses of storage locations of a memory tile of a plurality of memory tiles, each of the memory addresses having a corresponding digit line conductor and a corresponding access line conductor, each memory tile of the plurality of memory tiles comprising an array of storage components at intersections of a plurality of digit line conductors and a plurality of access line conductors; and
selecting the corresponding digit line conductors and the corresponding access line conductors to the determined memory addresses of the storage locations of the memory tile to access the storage locations of the memory tile,
wherein at least two or more storage components of the memory tile are selected before selecting the storage components of a different memory tile of the plurality of memory tiles, and
wherein determining the memory addresses of the storage locations of the memory tile comprises determining a first memory address of a first storage location of the memory tile based at least partly on a second memory address of a second storage location of the memory tile, the first and second memory addresses having different corresponding digit line conductors and different corresponding access line conductors.

11. The method of claim 10, wherein the corresponding digit line conductors and the corresponding access line conductors are selected so that accessing data stored to one of the two or more storage components does not disrupt successfully accessing data stored to the other storage components of the two or more storage components.

12. The method of claim 10, wherein the corresponding digit line conductors and the corresponding access line conductors are selected so that two consecutively accessed storage locations of the memory tile are non-adjacent to each other in the array of storage components of the memory tile.

13. The method of claim 12, wherein the corresponding digit line conductors and the corresponding access line conductors are selected so that consecutively accessed storage locations of the memory tile are along a diagonal from one another in the array of storage components of the memory tile, the consecutively accessed storage locations being accessible by different access circuitry configured to access the storage components of the memory tile.

* * * * *